United States Patent [19]
Wakino et al.

[11] Patent Number: 5,451,882
[45] Date of Patent: Sep. 19, 1995

[54] METHOD OF MEASURING DIELECTRIC CONSTANT OF POWDER

[75] Inventors: Kikuo Wakino; Katsumi Yukawa; Shunjiro Imagawa, all of Kyoto, Japan

[73] Assignee: Murata Mfg. Co., Ltd., Japan

[21] Appl. No.: 142,774

[22] Filed: Oct. 25, 1993

[30] Foreign Application Priority Data

Oct. 28, 1992 [JP] Japan ................. 4-289849

[51] Int. Cl.$^6$ ............................ G01N 27/22
[52] U.S. Cl. ..................... 324/663; 361/281
[58] Field of Search ............ 324/663, 664, 72; 361/277, 280, 281

[56] References Cited

U.S. PATENT DOCUMENTS 3,774,238 11/1973 Hardway ................ 324/663
4,482,478 11/1984 Shaw ..................... 252/579

*Primary Examiner*—Kenneth A. Wieder
*Assistant Examiner*—Glenn W. Brown
*Attorney, Agent, or Firm*—Ostrolenk, Faber, Gerb & Soffen

[57] ABSTRACT

Powder and a liquid medium are introduced between a pair of electrode members which are opposed to each other with a constant space, formed there between and an apparent dielectric constant of a composite system of the powder and the liquid medium is measured with a powder volume ratio being set at 0.45 to 0.55 and a measuring frequency of at least 1 MHz. The measured value is applied to the logarithmic mixing rule or the Lichtone-Rother equation, to find the dielectric constant of the powder. It is possible to reliably find the dielectric constant of the powder with application of the logarithmic mixing rule or the Lichtone-Rother equation.

3 Claims, 1 Drawing Sheet

METHOD OF MEASURING DIELECTRIC CONSTANT OF POWDER

BACKGROUND OF THE INVENTION

1. Field of the Invention

The present invention relates to a method of measuring the dielectric constant of powder, and more particularly, it relates to a method of measuring the dielectric constant of powder by measuring an apparent dielectric constant of a composite system of the powder and a liquid medium and thereafter finding the dielectric constant of the powder with application of the logarithmic mixing rule or the Lichtone-Rother equation.

2. Description of the Background Art

While various dielectrics are employed in the field of electronic components, for example, it is necessary to measure the dielectric constant of the dielectric that is employed, in order to design an electronic component. An inorganic dielectric such as ceramic, for example, which is applied to an electronic component is generally prepared in a state of powder. In evaluation of the dielectric constant of an inorganic dielectric such as ceramic, therefore, ceramic powder is generally molded with a binder and the compact thereby obtained is then fired and provided on its surface with a silver electrode, to be subjected to the measurement of the dielectric constant.

However, the aforementioned method of measuring the dielectric constant is rather inferior in efficiency. In order to solve this problem, there has been proposed the following method of finding the dielectric constant of powder as such.

A container provided with a pair of electrodes, which are opposed to each other at a constant distance, is prepared so that powder to be subjected to measurement of its dielectric constant $\epsilon_1$ is introduced therein with a liquid medium having a known dielectric constant. In this state, a voltage is applied across the pair of electrodes, to measure an apparent dielectric constant $\epsilon$ of a composite system of the powder and the liquid medium. Then, the dielectric constant $\epsilon_1$ of the powder is found by an equation, such as the logarithmic mixing rule or the Lichtone-Rother equation, for calculating the dielectric constant of a mixed material. In more concrete terms, the dielectric constant $\epsilon_1$ of the powder is calculated by the logarithmic mixing rule:

$$\log \epsilon = v_1 \log \epsilon_1 + v_2 \log \epsilon_2$$

or the Lichtone-Rother equation:

$$\epsilon^k = v_1\epsilon_1^k + v_2\epsilon_2^k (-1 \leq k \leq 1)$$

where $\epsilon_1$ represents the dielectric constant of the powder, $\epsilon_2$ represents the dielectric constant of the liquid medium, $v_1$ represents the volume ratio of the powder, and $v_2$ represents the volume ratio of the liquid medium.

However, neither the logarithmic mixing rule nor the Lichtone-Rother equation has a theoretical ground, although the same is convenient for approximately calculating the dielectric constant of a mixed material. Therefore, the dielectric constant value of a composite system which is calculated according to the aforementioned logarithmic mixing rule or Lichtone-Rother equation may disagree with a measured value. This means that the dielectric constant value of the powder measured by the above mentioned is not reliable.

SUMMARY OF THE INVENTION

Accordingly, an object of the present invention is to provide a method of measuring the dielectric constant of powder, which can improve the reliability in measurement with application of the aforementioned logarithmic mixing rule or Lichtone-Rother equation.

The present invention is directed to a method of measuring the dielectric constant of powder by introducing the powder to be subjected to measurement of its dielectric constant and a liquid medium having a known dielectric constant into a container provided with a pair of electrodes which are opposed to each other with a constant space formed therebetween, applying a voltage across the pair of electrodes for measuring an apparent dielectric constant of a composite system of the powder and the liquid medium, and introducing the measured value $\epsilon$ into the logarithmic mixing rule:

$$\log \epsilon = v_1 \log \epsilon_1 + v_2 \log \epsilon_2$$

or the Lichtone-Rother equation:

$$\epsilon^k = v_1\epsilon_1^k + v_2\epsilon_2^k (-1 \leq k \leq 1)$$

where $\epsilon_1$ represents the dielectric constant of the powder, $\epsilon_2$ represents the dielectric constant of the liquid medium, $v_1$ represents the volume ratio of the powder, and $v_2$ represents the volume ratio of the liquid medium as hereinabove described, thereby finding the dielectric constant $\epsilon_1$ of the powder.

The present inventors have found that it is possible to measure the dielectric constant of powder with high reliability using the aforementioned logarithmic mixing rule or Lichtone-Rother equation by properly selecting conditions for measuring an apparent dielectric constant of a composite system of the powder and a liquid medium. The present invention is intended to provide conditions for enabling such a measurement in high reliability, and characterized in that a powder volume ratio with the composite system of the powder and the liquid medium which is located between a pair of electrodes is set at 0.45 to 0.55, and a voltage which is applied across the pair of electrodes has a frequency of at least 1 MHz.

In the present invention, it has been experimentally confirmed that there is no great difference between the calculated and the measured dielectric constant values of a composite system of powder and a liquid medium when the powder volume ratio is set at 0.45 to 0.55.

In the present invention, it has also been confirmed that the dielectric constant can be measured substantially with no influence by moisture when a voltage having a frequency of at least 1 MHz is applied across the pair of electrodes.

According to the present invention, therefore, it is possible to find the dielectric constant of powder as such by using the logarithmic mixing rule or the Lichtone-Rother equation in high reliability. Consequently, the steps of mixing the powder with a binder, molding and firing the mixture and providing a silver electrode or the like are not required in order to find the dielectric constant of an inorganic dielectric such as ceramic, and efficient measurement is enabled. Thus, an electronic component can be easily designed with such a desired dielectric.

The foregoing and other objects, features, aspects and advantages of the present invention will become more apparent from the following detailed description of the present invention when taken in conjunction with the accompanying drawing.

DESCRIPTION OF THE PREFERRED EMBODIMENTS

Figure 1:
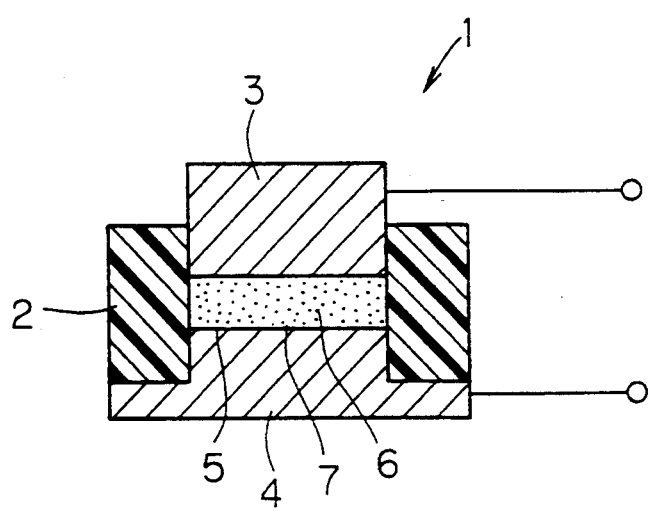
FIG. 1 is a sectional view showing a measuring container 1 for carrying out a method of measuring the dielectric constant of powder according to an embodiment of the present invention.

FIG. 1 is a sectional view showing a measuring container 1 which is applied to a method of measuring the dielectric constant of powder according to an embodiment of the present invention. The measuring container 1 comprises an electric insulating ring 2 of 10 mm in inner diameter, for example. This ring 2 is engaged with first and second electrode members 3 and 4 of a conductor such as a metal, thereby forming a closed space 5. This space 5 is charged with powder 6 that is to be subjected to measurement of its dielectric constant and a liquid medium 7 having a known dielectric constant $\epsilon_2$. The first and second electrode members 3 and 4 are separated from each other by a constant space formed therebetween of 1 mm, for example.

The aforementioned liquid medium 7 is preferably prepared from a non-polar organic liquid medium having excellent wettability with respect to the powder 6 and a higher dielectric constant than air. To this end, it is possible to advantageously employ an organic liquid medium such as $\gamma$-glycyloxypropyl polymethoxysilane, for example, which is commercially available as a finishing agent.

In such a measuring container 1, the powder 6 is homogeneously dispersed in the liquid medium 7, while a voltage is applied across the first and second electrode members 3 and 4, to measure an apparent dielectric constant $\epsilon$ of a composite system of the powder 6 and the liquid medium 7. At this time, the dielectric constant $\epsilon$ is corrected for the dielectric constant supplied by the measuring container 1 as a matter of course.

The apparent dielectric constant $\epsilon$ of the composite system of the powder 6 and the liquid medium 7 determined as described above is applied to the aforementioned logarithmic mixing rule or Lichtone-Rother equation. In the logarithmic mixing rule or the Lichtone-Rother equation, the dielectric constant $\epsilon_2$ of the liquid medium 7 is known and the volume ratios $v_1$ and $v_2$ of the powder 6 and the liquid medium 7 have already been decided in the previous stage of previous preparation of the mixture of the powder 6 and the liquid medium 7, respectively. When the apparent dielectric constant $\epsilon$ of the composite system of the powder 6 and the liquid medium 7 is obtained, therefore, it is possible to find the dielectric constant $\epsilon_1$ of the powder 6.

According to the present invention, the aforementioned measuring container 1 is employed so as to measure the apparent dielectric constant $\epsilon$ of the composite system of the powder 6 and the liquid medium 7 while setting the powder volume ratio in the composite system located between the first and second electrode members 3 and 4 at 0.45 to 0.55 and applying a voltage having a frequency of at least 1 MHz across the first and second electrode members 3 and 4. Experimental Examples forming the ground for such conditions are now described.

The measuring container 1 shown in FIG. 1 was employed to measure the dielectric constant of the composite system of the powder 6 and the liquid medium 7 at the room temperature of 25° C. while varying the powder volume ratio in a range of 0.2 to 0.65 and applying a voltage having a frequency of 1 MHz across the first and second electrode members 6 and 7. The powder 6 was prepared from calcium titanate, and the liquid medium 7 was prepared from $\gamma$-glycyloxypropyl polymethoxysilane.

Table 1 shows measured values of the dielectric constant of the composite system at various powder volume ratios with calculated values thereof, and values of deviation of the former from the latter. Such values of deviation were calculated on the basis of an equation [(measured value)−(calculated value)]/(measured value). The calculated values were found from known dielectric constants of calcium titanate and $\gamma$-glycyloxypropyl polymethoxysilane, respectively, on the basis of the logarithmic mixing rule.

TABLE 1

| Powder Rate | Measured Value | Calculated Value | Deviation |
| --- | --- | --- | --- |
| 0.2 | 6.69 | 17.5 | −1.62 |
| 0.3 | 11.8 | 23.4 | −0.98 |
| 0.4 | 21.9 | 31.4 | −0.43 |
| 0.5 | 39.3 | 42.0 | −0.07 |
| 0.52 | 44.8 | 43.8 | 0.02 |
| 0.53 | 50.6 | 45.8 | 0.09 |
| 0.6 | 50.2 | 56.2 | −0.12 |
| 0.65 | 54.4 | 65.0 | −0.19 |

As shown in Table 1, the values of deviation were extremely small when the powder volume rates were 0.5, 0.52 and 0.53, i.e., within a range of 0.45 to 0.55. Thus, it is understood that the dielectric constant of powder can be found with high reliability with the logarithmic mixing rule. In particular, the value of deviation was minimized when the powder volume ratio was 0.52. The powder volume ratio was set at 0.52 to find the dielectric constant of calcium titanate from a measured value with the logarithmic mixing rule, whereby a result of 188 was found in excellent agreement of 102% with a nominal value of 180 of its sintered product.

Then, the frequency of a voltage which was applied across the first and second electrode members 3 and 4 was varied in a range of 1 kHz to 1 MHz in the measuring container 1 shown in FIG. 1 while keeping the powder volume rate at 0.52, to measure values of an apparent dielectric constant and a dielectric dissipation factor DF of the composite system of the powder 6 and the liquid medium 7. Table 2 shows the results.

TABLE 2

| | Frequency | | | |
| --- | --- | --- | --- | --- |
| | 1 kHz | 10 kHz | 100 kHz | 1 MHz |
| Dielectric Constant | 48.9 | 45.1 | 44.8 | 44.8 |
| DF | .072 | .011 | .002 | .001 |

Further, values of the dielectric constant and the dielectric dissipation factor DF of the liquid medium 7 were independently measured in a similar manner to the above. Table 3 shows the results.

TABLE 3

| | Frequency | | | |
|---|---|---|---|---|
| | 1 kHz | 10 kHz | 100 kHz | 1 MHz |
| Dielectric Constant | 10.27 | 10.04 | 9.782 | 9.782 |
| DF | 1.525 | .1731 | .0193 | .0031 |

Noting the dielectric dissipation factors DF appearing in Tables 2 and 3 in particular, the dielectric dissipation factors DF were reduced as the frequencies were increased. Thus, it is understood that the dielectric constant can be measured substantially with no influence by moisture contained in the powder 6 or the liquid medium 7 when the frequency is at least 1 MHz.

Although the dielectric constants were evaluated on the basis of the logarithmic mixing rule in the aforementioned Experimental Examples, substantially similar results can be found also when the same are evaluated on the basis of the Lichtone-Rother equation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of measuring the dielectric constant of powder comprising the steps of:

introducing powder to be subjected to measurement of its dielectric constant and a liquid medium having a known dielectric constant into a container that is provided with a pair of electrodes that are opposed to each other with a constant space formed therebetween, applying a voltage across said pair of electrodes for measuring an apparent dielectric constant value of a composite system of said powder and said liquid medium, and introducing the measured value $\epsilon$ into the following equation:

$$\log \epsilon = V_1 \log \epsilon_1 + V_2 \log \epsilon_2$$

where $\epsilon_1$ represents the dielectric constant powder, $\epsilon_2$ represents the dielectric constant of said liquid medium, $v_1$ represents the volume ratio of said powder, and $v_2$ represents the volume ratio of said liquid medium, and a powder volume ratio in said composite system of said powder and said liquid medium that is located between said pair of electrodes being set at 0.45 to 0.55, and said voltage applied across said pair of electrodes having a frequency of at least 1 MHz.

2. A method of measuring the dielectric constant of powder in accordance with claim 1, wherein said liquid medium is prepared from a non-polar organic liquid medium having excellent wettability with respect to said powder and a higher dielectric constant than air.

3. A method of measuring the dielectric constant of powder in accordance with claim 2, wherein γ-glycyloxypropyl polymethoxysilane is employed as said organic liquid medium.

* * * * *